(12) United States Patent
Heres et al.

(10) Patent No.: US 7,989,934 B2
(45) Date of Patent: Aug. 2, 2011

(54) CARRIER FOR BONDING A SEMICONDUCTOR CHIP ONTO AND A METHOD OF CONTRACTING A SEMICONDUCTOR CHIP TO A CARRIER

(75) Inventors: Klaas Heres, Berkel en Rodenrijs (NL); Paul Dijkstra, Eindhoven (NL); Maarten Nollen, Eindhoven (NL)

(73) Assignee: NXP B.V., Eindhoven (NL)

( * ) Notice: Subject to any disclaimer, the term of this patent is extended or adjusted under 35 U.S.C. 154(b) by 44 days.

(21) Appl. No.: 12/526,619

(22) PCT Filed: Feb. 11, 2008

(86) PCT No.: PCT/IB2008/050483
§ 371 (c)(1),
(2), (4) Date: Aug. 10, 2009

(87) PCT Pub. No.: WO2008/099326
PCT Pub. Date: Aug. 21, 2008

(65) Prior Publication Data
US 2010/0006996 A1 Jan. 14, 2010

(30) Foreign Application Priority Data
Feb. 14, 2007 (EP) .................................. 07003106

(51) Int. Cl.
*H01L 23/495* (2006.01)
(52) U.S. Cl. ................. 257/676; 257/E23.031; 257/779
(58) Field of Classification Search .................. 257/676, 257/779, E23.031; 438/123, 612
See application file for complete search history.

(56) References Cited

U.S. PATENT DOCUMENTS

| | | | |
|---|---|---|---|
| 5,304,843 A | 4/1994 | Takubo et al. | |
| 6,518,508 B2* | 2/2003 | Park et al. | 174/255 |
| 6,642,610 B2* | 11/2003 | Park et al. | 257/678 |
| 6,700,188 B2* | 3/2004 | Lin | 257/684 |
| 2004/0245613 A1 | 12/2004 | Lee | |
| 2007/0126094 A1* | 6/2007 | Shojaie et al. | 257/676 |
| 2007/0296069 A1* | 12/2007 | Terui et al. | 257/676 |
| 2008/0061414 A1* | 3/2008 | Retuta et al. | 257/676 |
| 2008/0224290 A1* | 9/2008 | Abbott | 257/676 |
| 2009/0166824 A1* | 7/2009 | Do et al. | 257/676 |
| 2009/0166825 A1* | 7/2009 | Camacho et al. | 257/676 |
| 2009/0194858 A1* | 8/2009 | Youn et al. | 257/676 |
| 2009/0283884 A1* | 11/2009 | Kang et al. | 257/676 |
| 2010/0224972 A1* | 9/2010 | Powell et al. | 257/676 |
| 2010/0295161 A1* | 11/2010 | Koduri | 257/676 |

FOREIGN PATENT DOCUMENTS
EP    0967649 A    12/1999
* cited by examiner

*Primary Examiner* — Nathan Ha

(57) ABSTRACT

A carrier (100) for bonding a semiconductor chip (114) onto is provided, wherein the carrier (100) comprises a die pad (101) and a plurality of contact pads (102), wherein each of the plurality of contact pads (102) comprises an electrically conductive multilayer stack, wherein the electrically conductive multilayer stack comprises a surface layer (109), a first buffer layer, and a first conductive layer (108). Furthermore, the first buffer layer comprises a material adapted to prevent diffusion of material of the surface layer (109) into the first conductive layer (108), and at least two of the contact pads (102) has an ultrafine pitch relative to each other.

16 Claims, 8 Drawing Sheets

CARRIER FOR BONDING A SEMICONDUCTOR CHIP ONTO AND A METHOD OF CONTRACTING A SEMICONDUCTOR CHIP TO A CARRIER

FIELD OF THE INVENTION

The invention relates to a carrier for bonding a semiconductor chip onto.

Moreover, the invention relates to a method of contacting a semiconductor chip to a carrier.

Further, the invention relates to a semiconductor chip package.

BACKGROUND OF THE INVENTION

Carriers and methods of contacting a semiconductor chip to a carrier are known. The known carriers are usually carriers of Al, Cu, Fe—Ni alloy or of a stack of Cu—Al or Al—Cu—Al. The carrier is provided on the first side with the desired pattern and with a conductive layer of at least one of the metals Ni, Au, Ag and Pd. In the manufacturing process of the device, after placing a semiconductor element and providing the envelope, the part of the carrier wherein the pattern is not provided is removed. Subsequently, a mask is photolithographically provided on the second side of the carrier, after which contact surfaces or guide pins are formed. Thereafter, the semiconductor element is connected electrically to the contact surfaces, e.g. by soldering bonding wires between bonding pads of the semiconductor element and the contact surfaces.

However, the Soldering May Cause Some Problems Due to Non-Wetting Solder paste, which may result in failure on board level mounting and in reliability risks.

OBJECT AND SUMMARY OF THE INVENTION

It is an object of the invention to provide a carrier and a method for contacting a semiconductor ship to a carrier which method may be less prone to non-wetting or may have increased reliability.

In order to achieve the object defined above, a carrier for bonding a semiconductor chip onto, a method of contacting a semiconductor chip to a carrier, and a semiconductor chip package according to the independent claims are provided.

According to an exemplary embodiment of the invention, a carrier for bonding a semiconductor chip onto is provided, wherein the carrier comprises a die pad and a plurality of contact pads, wherein each of the plurality of contact pads comprises an electrically conductive multilayer stack, wherein the electrically conductive multilayer stack comprises a surface layer, a barrier layer, and a first conductive layer. Furthermore, the barrier layer comprises a material adapted to prevent diffusion of material of the surface layer into the first conductive layer, and at least two of the contact pads have an ultrafine pitch relative to each other.

According to an exemplary embodiment of the invention a semiconductor chip package is provided, which semiconductor chip package comprises a carrier according to an exemplary embodiment of the invention, a semiconductor chip, and an encapsulation, wherein the semiconductor chip has a first side and an opposite, second side with a plurality of bond pads on the first side. Further, the semiconductor chip is attached with its second side to the die pad, and the at least one contact pad is electrically coupled to one of the plurality of bond pads of the chip. Furthermore, the encapsulation encapsulates the semiconductor chip and mechanically anchors the die pad and the plurality of contact pads, while a surface of the contact pads is exposed from the encapsulation to constitute terminals. In particular, the semiconductor chip may be bonded to the die pad either directly or via an intermediate die.

According to an exemplary embodiment of the invention a method of contacting a semiconductor chip to a carrier is provided, which method comprises providing a carrier comprising a die pad, a plurality of contact pads, wherein at least one of the contact pad comprises: an electrically conductive multilayer stack of a surface layer, a barrier layer, and a first conductive layer, wherein the barrier layer is arranged between the first conductive layer and the surface layer, an ultrafine pitch relative to another one of the plurality of contact pads, and wherein the barrier layer comprises a material adapted to prevent diffusion of material of the surface layer into the first conductive layer. Furthermore, the method comprises attaching a semiconductor chip onto the die pad, wherein the semiconductor chip comprises a plurality of bond pads, and contacting at least one bond pad with the at least one contact pad.

In particular, the multilayer stack of the carrier may comprise further a buffer layer, a second conductive layer and an adhesive layer. Preferably, the sequence of the layers is the surface layer, the barrier layer, the first conductive layer, the buffer layer, the second conductive layer and the adhesive layer. In particular, the conductive layers are electrically conductive layers, e.g. metal layers. Possible materials for the multilayer stack may be for the conductive layers copper, silver or alloys thereof and for the buffer layer, aluminum, FeNi, FeCrNi, stainless steel, or alloys thereof. The surface and the adhesive layer itself may also have a multilayered structure and may comprise layers comprising nickel, palladium, gold or alloys thereof. In particular, the surface and the adhesive layer may be used as etch masks for etching processes in the manufacturing of the semiconductor chip package. Furthermore, the barrier layer, e.g. made of palladium, may be a part of the surface layer and/or of the adhesive layer, i.e. it may be also called a sublayer of the surface layer and/or of the adhesive layer. In particular, the multilayered structure of the contact pads may be a symmetrically structure, i.e. a sequence of layers may be the same when listed in one direction or in the other opposite direction. For example, the adhesive layer and the surface layer may have the same structure and materials, as well as the first conductive layer and the second conductive layer comprises the same material. The barrier layers may also be called buffer layers. In particular, the semiconductor chip package may form an Integrated Circuit (IC) or a part thereof.

The term "ultrafine pitch" may particularly denote the fact that the corresponding contact pads, i.e. the pads defining the pitch, are close together. In particular, the ultrafine pitch, i.e. the distance between the two contact pads (also called spacing), may be smaller than the width of the pads, i.e. a length which is measured in the direction of a line the contact pads are arranged along. Preferably, a pitch may be called ultrafine in case the pitch is smaller than 1.0 mm, more particularly the distance between the contact pads is smaller than 0.5 mm. Ultrafine-pitch may particularly be applied in larger packages, such as for example dual or even multirow Quad Flat package No leads (QFN) package or in a ball grid array (BGA) package where the pins are replaced by balls of solder stuck to the bottom of the package. Both the BGA and QFN package may be used in surface mounted electronic circuits designs.

The carrier may be a part of an Ultra-Thin-Leadless-Package (UTLP) lead frame and may be masked and etched in a lead frame manufacturing process. Such an UTLP may be suitable for a wide range of dimensions, e.g. in number of input/output terminals (I/O) and area. A complete UTLP range may start from about 5 I/O up to 200 I/O.

It may be seen as a gist of an exemplary embodiment that a carrier is provided, which comprises a plurality of contact pads formed by a multilayered structure comprising at least a surface layer, a first conductive layer and a barrier or buffer layer in between. The barrier layer may comprise a material, which is selected in such a way that a diffusion of material of the surface layer into the first conductive layer is prevented or at least decreased when the contact pad is connected to a semiconductor chip, e.g. by soldering a bond wire onto the surface layer of the contact pad. The barrier layer may prevent in particular that small amounts of wetting material, e.g. gold, arranged on the surface layer diffuses into the first conductive layer. The provision of a barrier layer comprising a barrier material or a material inhibiting diffusion may in particular advantageous in case the contact pads have an ultrafine pitch, since otherwise shorts might arise due to the fact that the amount of solder and solder paste has to be increased to decrease the probability of non-wetting. However, such an increasing of the solder and solder paste may increase the probability of shorts due to the ultrafine pitch.

Next, further exemplary embodiments of the carrier for bonding a semiconductor chip onto are described. However, these embodiments also apply to the method of contacting a semiconductor chip to a carrier and to the semiconductor chip package.

According to another exemplary embodiment of the carrier the plurality of contact pads are arranged in at least two rings around the die pad. In particular, a first number of the plurality of contact pads is arranged in a first ring, while other contact pads of the plurality of contact pads are arranged in a second ring. These rings may have the shape of rectangles arranged around the die pad, which die pad may be arranged in the middle of the rings. These rings may in particular arranged substantially parallel to each other, i.e. each ring may comprise four rows each of which forms one side of the rectangular ring. In particular, the contact pad may have a rectangular shape and may be oriented in such a way that one side of each of the contact pads is arranged substantially parallel to the rows.

According to another exemplary embodiment of the carrier at least some of the contact pads in a first ring of the at least two rings are located in a staggered position with respect to their neighboring contact pads in a second ring of the at least two rings. In other words a chessboard like structure may be formed in which the contact pads may correspond to the black fields while the spaces may correspond to the white fields. However, a shifting between the arrangement of the contact pads in the two rows does not be necessarily correspond to the spacing of the contact pads in the rows, i.e. no real chessboard like arrangement has to be formed. In particular, an empty area between two adjacent contact pads of one row may be greater or smaller than the width of the corresponding contact pads, so that no real chessboard like pattern is possible. However a staggered pattern may be still possible.

Such a staggered arrangement may be in particular advantageous in case each single contact pad has to be contacted by a wire, since in such an arrangement, the wires used for contacting the contact pads of the first row and the wires used for contacting the contact pads of the second row may less interfere with each other.

According to another exemplary embodiment of the carrier the barrier layer comprises palladium. In particular, the thickness of the barrier layer may at least be 0.1 micrometer (μm).

The providing of palladium between the first conductive layer, e.g. formed by nickel, and the surface layer, e.g. formed by gold and used as a wetting agent, may be easily incorporated in presently existing process flows of Ultra-Thin-Leadless-Packages (UTLP) lead frame manufacturing. Even a barrier layer of only 0.1 μm thickness may be suitable to prevent a diffusion of gold of the surface layer into the first conductive layer. The palladium, may also function as an etch mask. However, other materials may also be used for an etch mask, e.g. a further layer of photoresist or another metal may be used. In particular, the surface layer or an adhesive layer itself may form an etch mask even in the case that the surface layer is formed by a multilayered structure itself, e.g. has sublayers of gold, nickel, and palladium.

According to another exemplary embodiment of the carrier the die pad comprises a main portion and an edge portion, wherein the main portion comprises a stack of the first conductive layer and the surface layer, while the edge portion comprises a second multilayer stack of an adhesion layer, a second conductive layer, a buffer layer, the first conductive layer and the surface layer.

According to another exemplary embodiment of the carrier the adhesion layer comprises a material that is specific for adhesion to copper and/or a material specific for adhesion to copper is applied onto the adhesion layer. In particular, the adhesion layer may be used so as to adhere one side of a semiconductor chip to the die pad.

Next, further exemplary embodiments of the semiconductor chip package are described. However, these embodiments also apply to the method of contacting a semiconductor chip to a carrier and to the carrier for bonding a semiconductor chip onto.

According to another exemplary embodiment of the semiconductor chip package the die pad has a surface that is exposed from the encapsulation, which surface is divided into a plurality of islands. These exposed surfaces may be a part of the surface layer of the multilayered structure. These islands may in particular be used for contacting a semiconductor element or the semiconductor chip.

According to another exemplary embodiment of the semiconductor chip package the multilayer stack of at least some of the plurality of contact pads comprise further a buffer layer, a second conductive layer, and an adhesive layer. In particular, the at least some of the plurality of contact pads comprises a portion in the second conductive layer that laterally extends beyond the corresponding terminal.

Next, further exemplary embodiments of the method of contacting a semiconductor chip to a carrier are described. However, these embodiments also apply to the carrier for bonding a semiconductor chip onto and to the semiconductor chip package.

According to another exemplary embodiment of the method the contacting is done by a soldering procedure. In particular, use may be made of stencil soldering.

Soldering may be an efficient way to contact a semiconductor chip onto a carrier, e.g. onto a die pad of the carrier or establish an electrical contact between the semiconductor chip and the contact pads by bonding wires. In particular, soldering may be used to electrically contact the semiconductor chip to the contact pads, e.g. by soldering bonding wires between bond pads of the semiconductor chip and the contact pads, i.e. to the adhesive layer of the contact pads, and/or for electrically contacting the semiconductor chip package electrically to an external electric or electronic component, e.g. by soldering bonding wires to the surface layer of the contact pads.

According to another exemplary embodiment of the method a leadfree solder is used. In particular, the leadfree solder comprises tin, silver, copper and/or an alloy thereof, or may consist of one of these materials.

An exemplary aspect of the invention may be seen in the fact that a method of soldering a semiconductor chip package, is provided, wherein the semiconductor chip has a first and an opposite, second side with a plurality of bond pads on the first side. Further, the semiconductor chip package comprises a plurality of contact pads and a die pad, wherein the chip is attached with its second side to the die pad and wherein at least a portion of the contact pads are electrically coupled to corresponding bond pads of the chip, each of which contact pads comprises an electrically conductive multilayer stack of an adhesion layer, a first conductive layer, a barrier layer, a second conductive layer and a surface layer. Furthermore, the semiconductor chip package comprises an encapsulation which encapsulates the chip and mechanically anchors the die pad and the contact pads, while a surface of the contact pads is exposed from the encapsulation to constitute terminals. In particular, the terminals are located in a first and a second ring around the die pad, at least some of the terminals have mutually an "ultrafine" pitch and a barrier layer is present between the first conductive layer and the surface layer to prevent diffusion of material from the surface layer into the first conductive layer.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

The illustration in the drawing is schematically. In different drawings, similar or identical elements are provided with the same reference signs.

In the following, referring to FIGS. 1A to G, a process for manufacturing a semiconductor chip package is described.

Figure 1A:
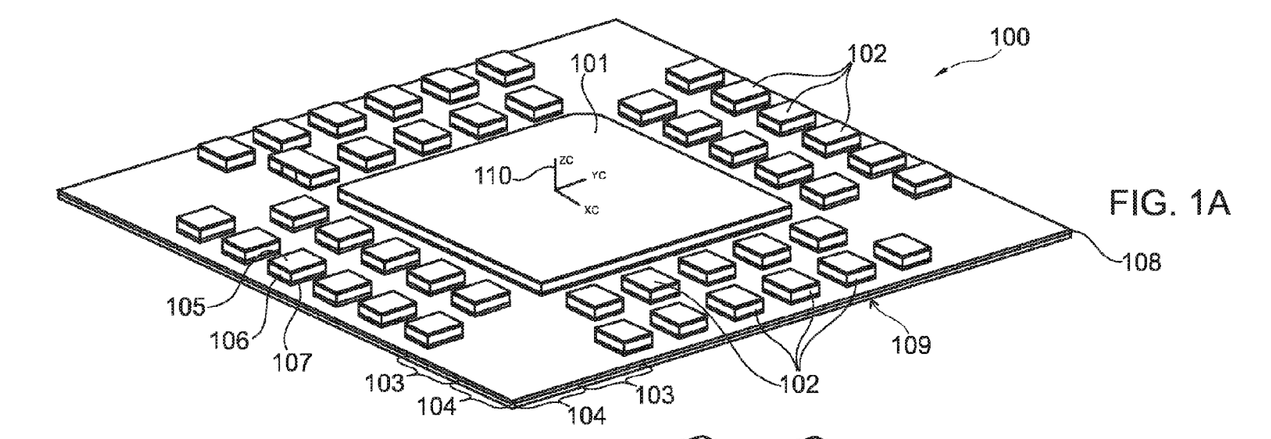
FIGS. 1A to G schematically show perspective views of a packaging process according to an exemplary embodiment.

FIG. 1A shows a perspective view of a carrier 100 comprising a die pad 101 which is arranged in the center of the carrier 100. Furthermore, the carrier comprises a plurality of contact pads 102 arranged in two rings around the die pad 101. The two rings are substantially rectangular, wherein a first ring 103 is closer to the die pad and may be called an inner ring, while a second ring 104 is arranged farther away from the die pad than the first ring and thus may be called an outer ring. The die pad 101 and the contact pads 102 are all made of a multilayered structure, which multilayered structure is indicated in the figures by the different layers. In particular, the whole multilayered structure is electrically conductive, e.g. all layers are formed by metal layers. Preferably, the multilayered structure comprises at least a surface layer 109, a first conductive layer 108 and a barrier layer disposed in between. In particular, the barrier layer is a thin palladium layer, e.g. about 0.1 μm, that is a sublayer of the surface layer 109, i.e. the surface layer 109 itself is a multilayered structure comprising layers of gold, palladium and nickel, wherein the gold layer is the outermost layer. Possible materials for the multilayer stack may be for the conductive layers copper, silver or alloys thereof and for the buffer layer aluminum, FeNi, FeCrNi, stainless steel, or alloys thereof. The barrier layers may also be called buffer layers. Furthermore, the multilayer structure comprises a buffer layer 107, a second conductive layer 106 and an adhesive layer 105, wherein the adhesive layer 105 may have the same composition, i.e. substructure, as the surface layer 109 In addition, a coordinate system 110 is shown in FIG. 1A indicating an x-direction XC, a y-direction YC and a z-direction ZC. In FIG. 1A it is also shown that the contact pads 102 of the first ring 103 are staggered with respect to the contact pads 102 of the second ring 104, i.e. the contact pads 102 of the inner ring 103 are arranged parallel to the spacing between the contact pads 102 of the outer ring 104.

Figure 1B:
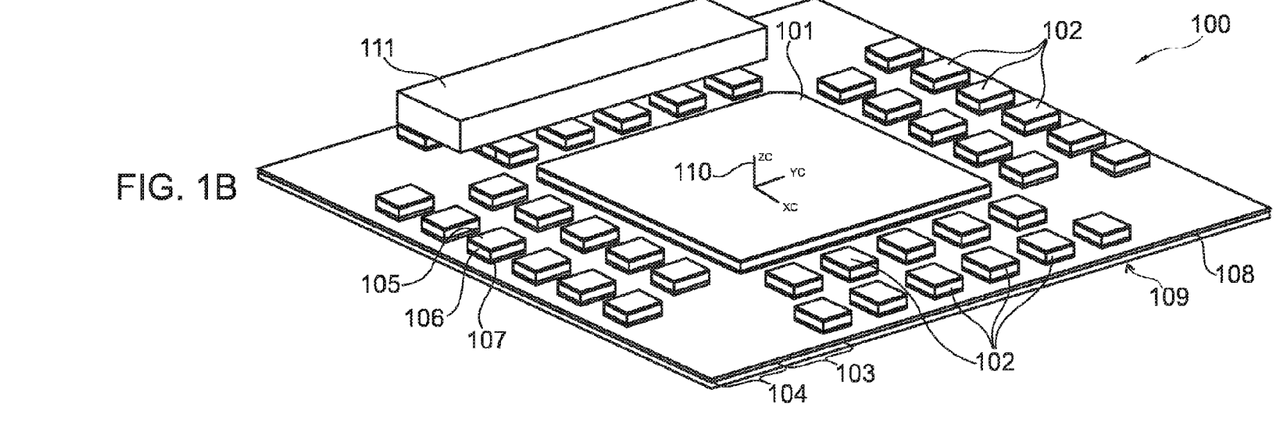

FIG. 1B shows a perspective view of the carrier 100 of FIG. 1A after a first processing step. In particular, a conductor 111, passive element or another electronic component is attached to one row of the inner ring 103 and the outer ring 104. The conductor 111 may be conventionally bonded to the contact pads, e.g. by soldering.

Figure 1C:
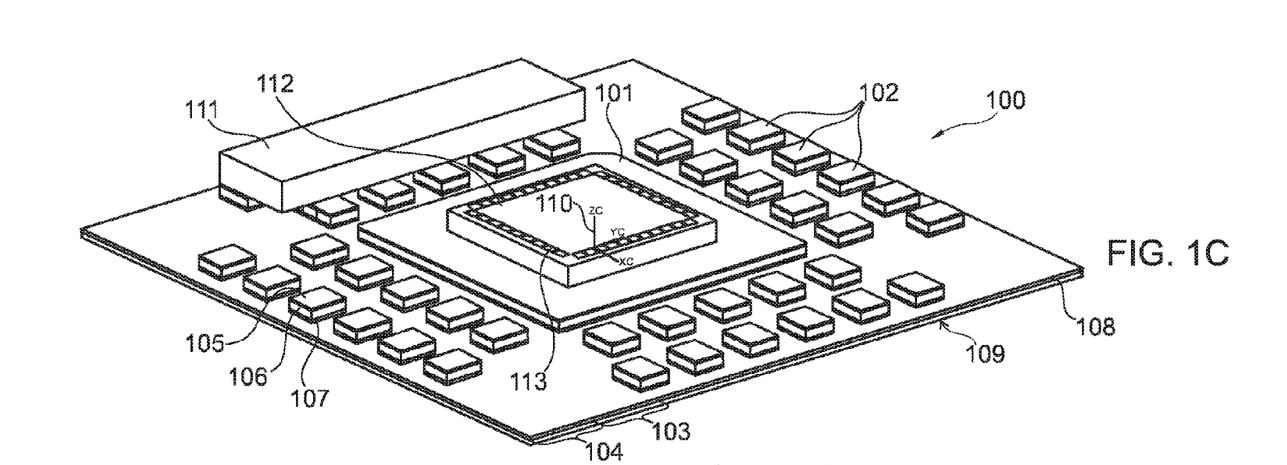

FIG. 1C shows a perspective view of the carrier 100 of FIG. 1B after a next processing step. In particular, an intermediate pad 112 is bonded to the surface layer of the die pad 101. The intermediate pad 112 comprises contact elements 113.

Figure 1D:
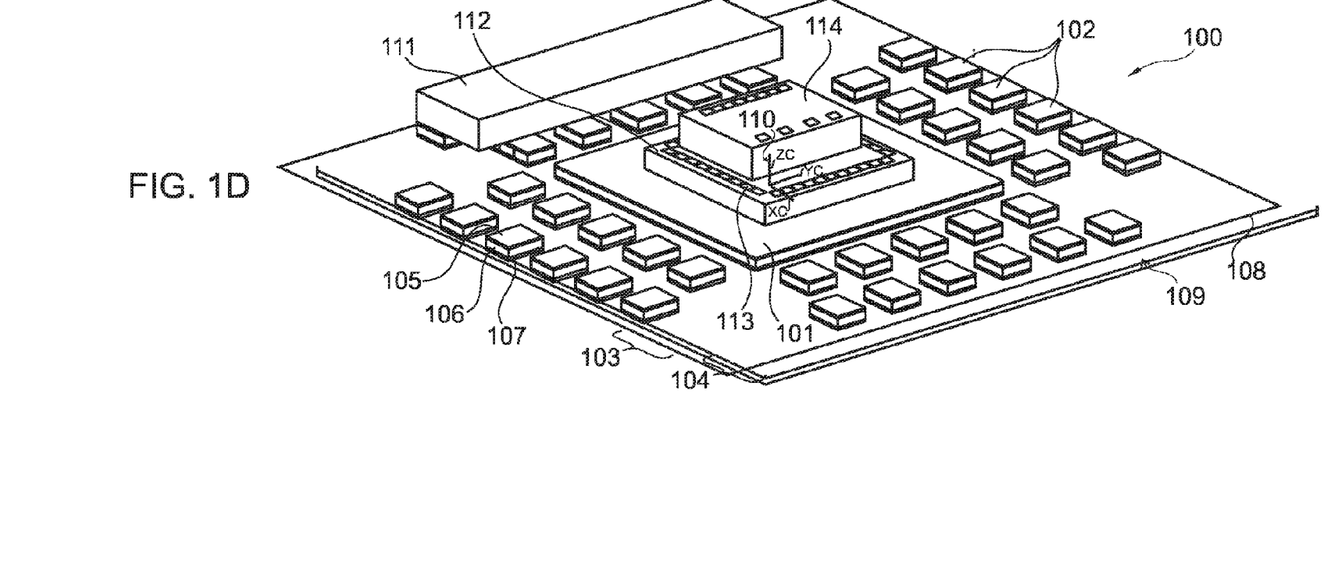

FIG. 1D shows a perspective view of the carrier 100 of FIG. 1C after a next processing step. In particular, a semiconductor chip 114 is bonded to the intermediate pad 112.

Figures 1E, 1F:
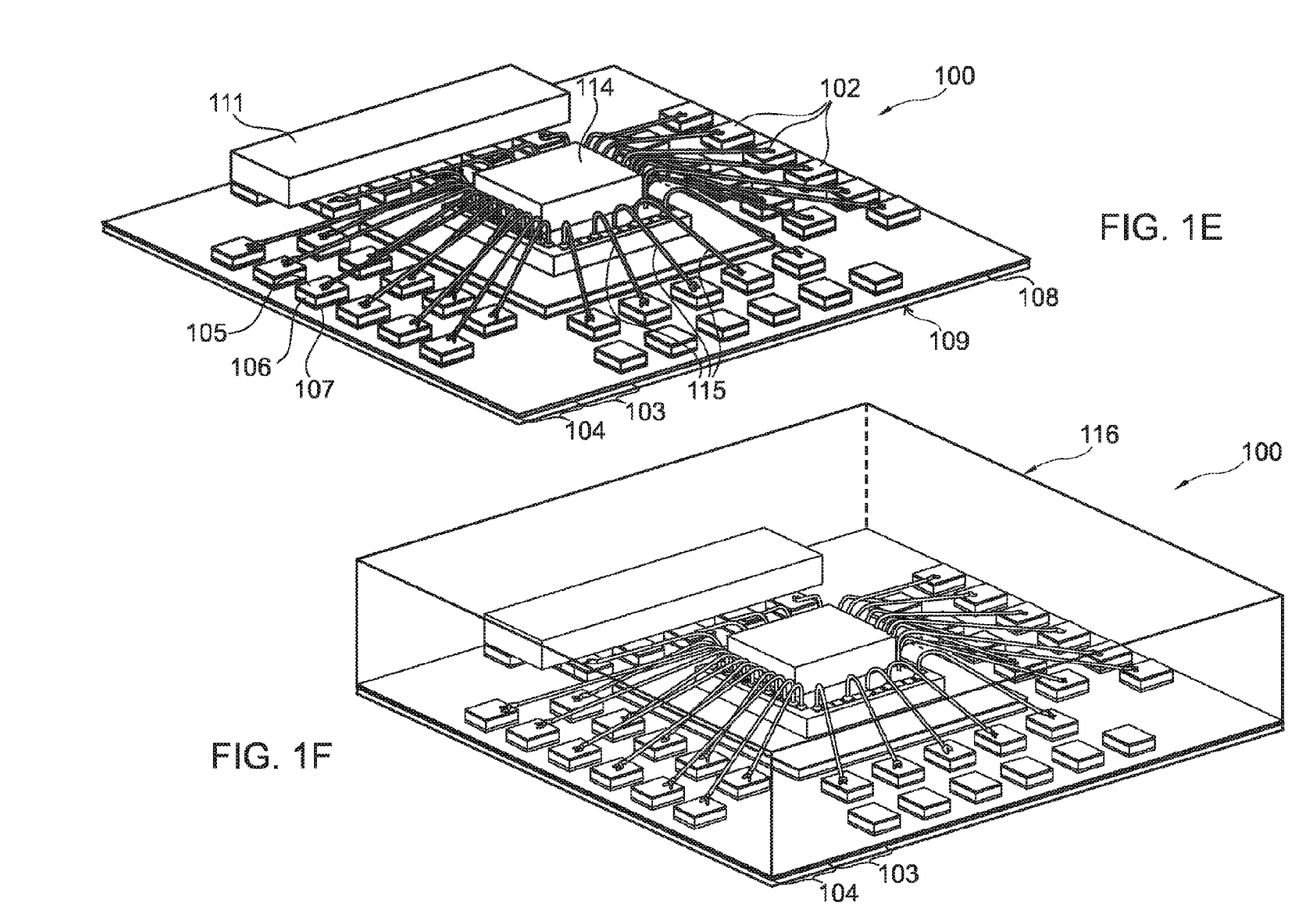

FIG. 1E shows a perspective view of the carrier 100 of FIG. 1D after a next processing step. In particular, a plurality of bonding wires 115 are attached to electrically connect some of the contacts elements 113 and some of the contact pads 102 of the carrier. Thus, the semiconductor chip 114 may be electrically connected to the contact pads 102 in case terminals of the semiconductor chip 114 are connected to the contact elements 113 when the semiconductor chip 104 is bonded to the intermediate pad 112.

FIG. 1F shows a perspective view of the carrier 100 of FIG. 1E after a next processing step. In particular, an encapsulation 116 is applied to the carrier 100 which encapsulation 116 encloses the upper part of the carrier 100, i.e. the contact pads 102, the intermediate pad 112, the semiconductor chip 114 and the bonding wires 115. However, the encapsulation 116 does not enclose the first conductive layer 108 and the surface layer 109 which are arranged on the underside of the carrier 100.

Figure 1G:
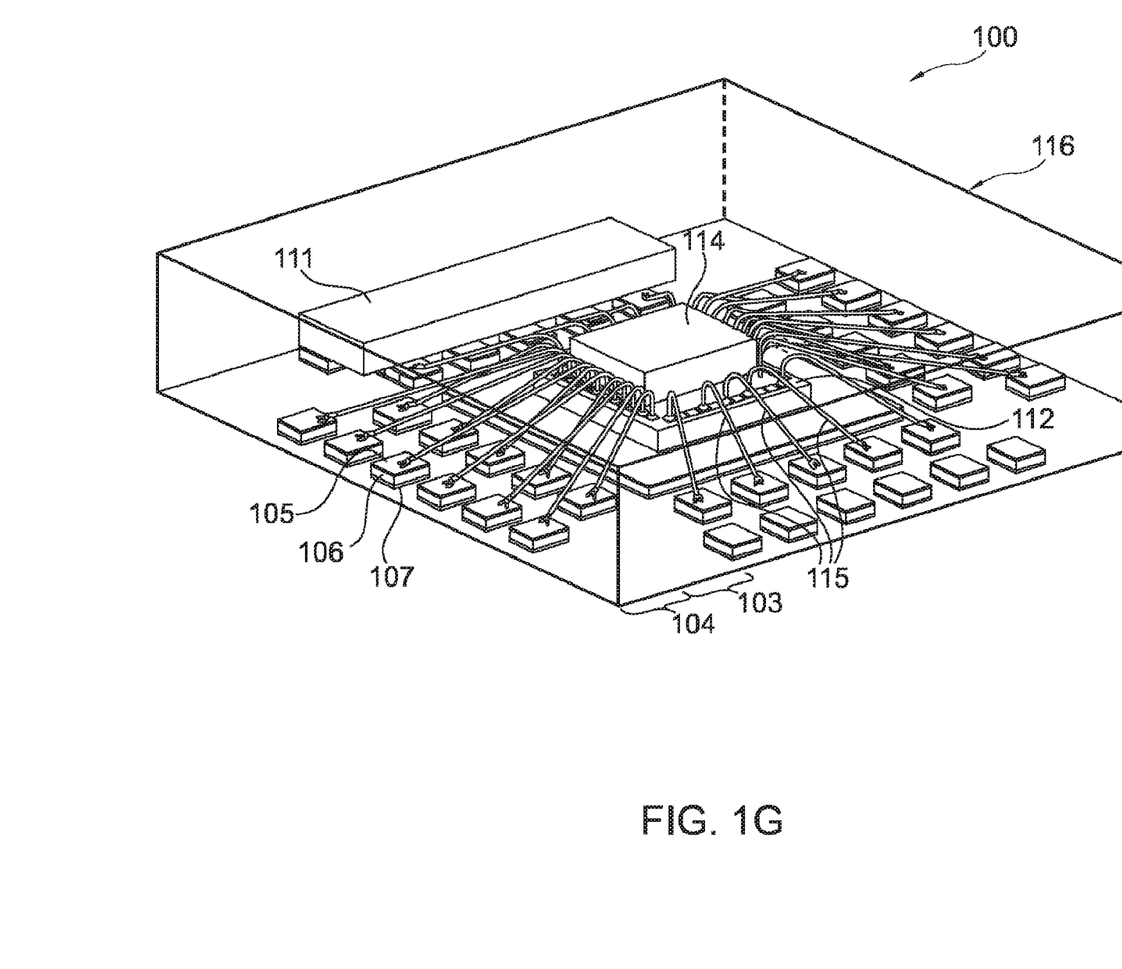

FIG. 1G shows a perspective view of the carrier 100 of FIG. 1F after a next processing step. In particular, the underside of the carrier 100 is structured; in particular the surface layer 109, the first conductive layer 108 and/or the buffer layer 107 may be structured in order to provide terminals that may be used to contact the encapsulated semiconductor chip 114. The buffer layer 107 is preferably structured in order to electrically insulate the individual contact pads from each other.

Figure 2A:
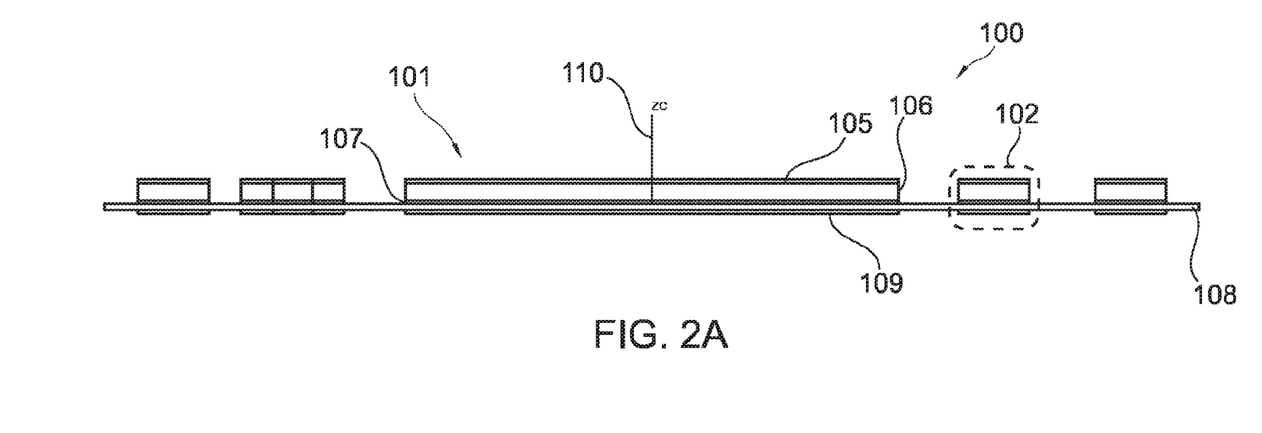
FIGS. 2A to G schematically show cross-sectional views of the packaging process depicted in FIG. 1A to 1G.

In the following, referring to FIGS. 2A to G, the process for manufacturing a semiconductor chip package of FIGS. 1A to G is further described. In particular, the FIG. 2A to G showing cross-sectional views of the perspective views of FIG. 1A to 1G FIG. 2A shows a cross-sectional view of the carrier 100 of FIG. 1A with the die pad 101, the plurality of contact pads 102. Furthermore, the multilayered structure can be more clearly seen in FIG. 2A than in FIG. 1A. In particular, the surface layer 109, the first conductive layer 108, the buffer layer 107, the second conductive layer 106 and the adhesive layer 105 are shown in FIG. 2A. In addition, the z-direction ZC is indicated in FIG. 2A.

Figure 2B:
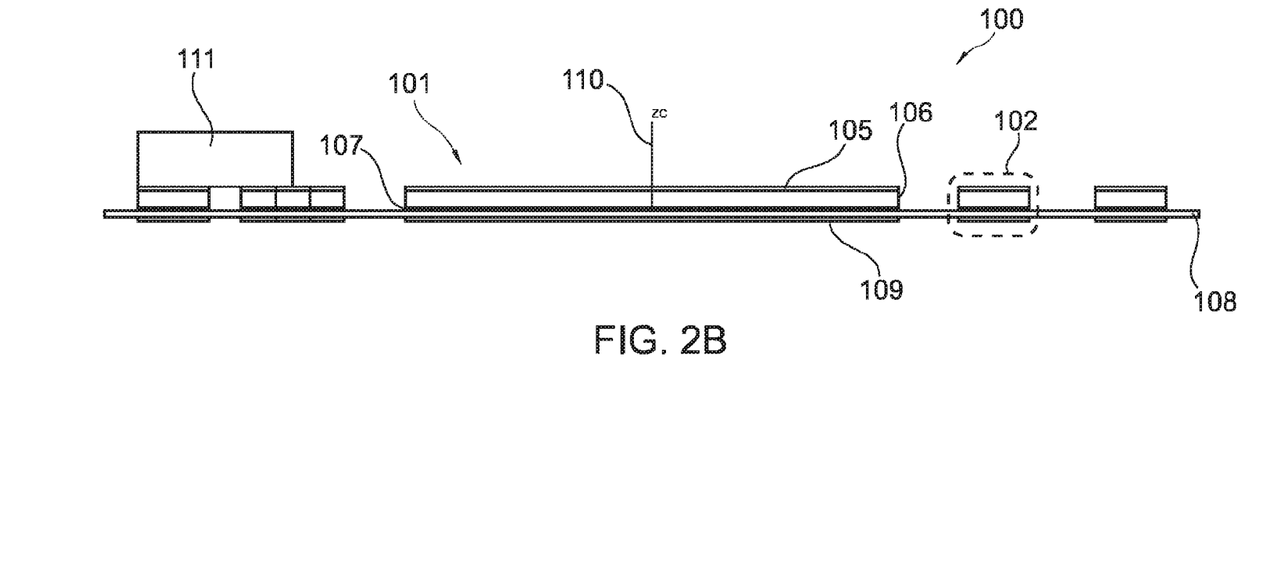

FIG. 2B shows a cross-sectional view of the carrier 100 of FIG. 1B. In particular, the conductor 111 is attached to one row of the inner ring 103.

Figure 2C:
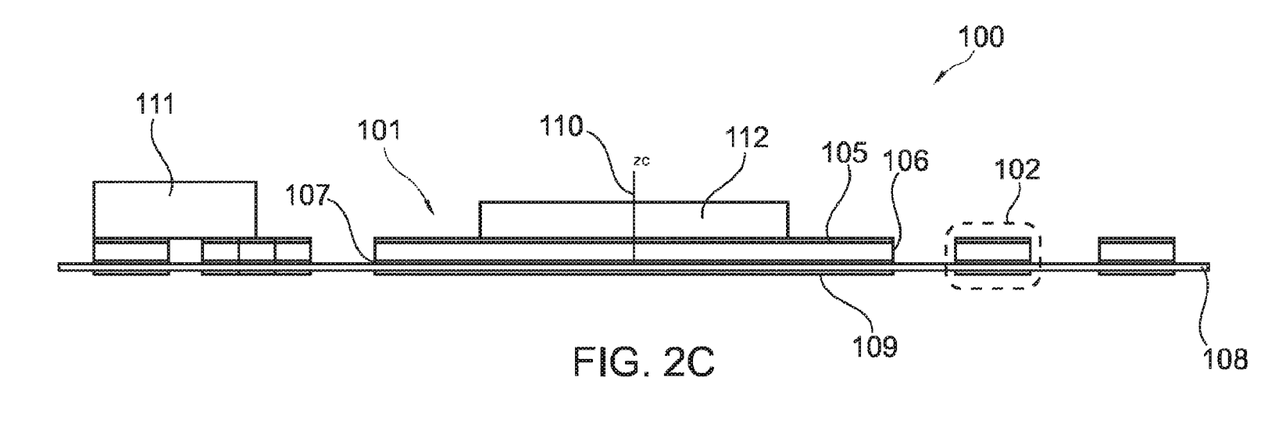

FIG. 2C shows a cross-sectional view of the carrier 100 of FIG. 1C. In particular, the intermediate pad 112 is bonded to the surface layer of the die pad 101.

Figure 2D:
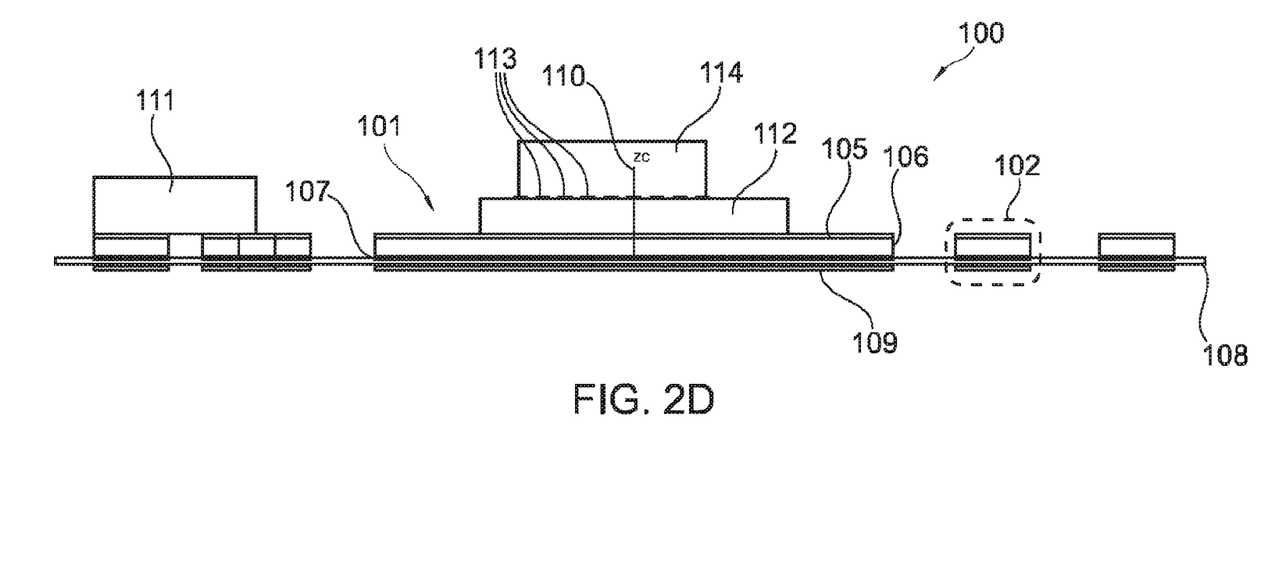

FIG. 2D shows a cross-sectional view of the carrier 100 of FIG. 1D. In particular, the semiconductor chip 114 is bonded to the intermediate pad 112.

Figure 2E:
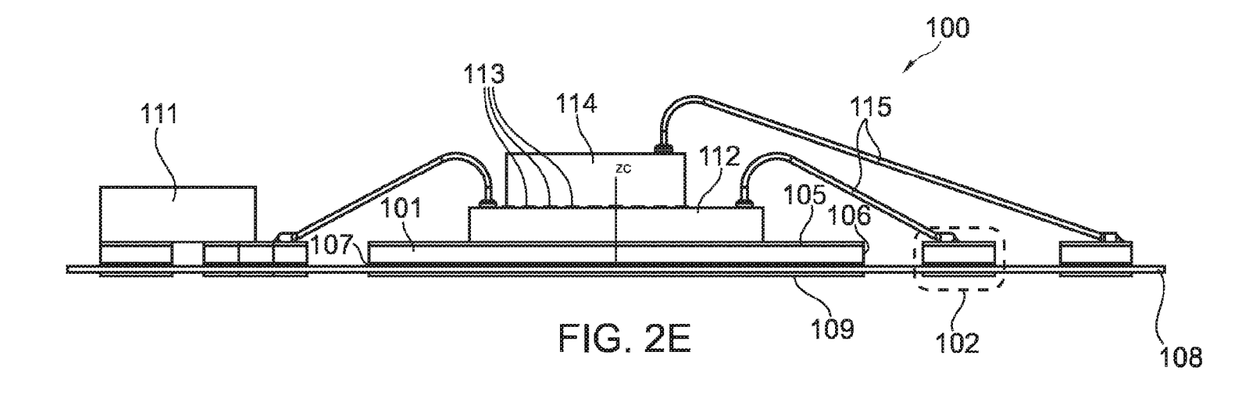

FIG. 2E shows a cross-sectional view of the carrier 100 of FIG. 1E. In particular, the plurality of bonding wires 115 are attached to electrically connect some of the contacts elements 113 and some of the contact pads 102 of the carrier.

Figure 2F:
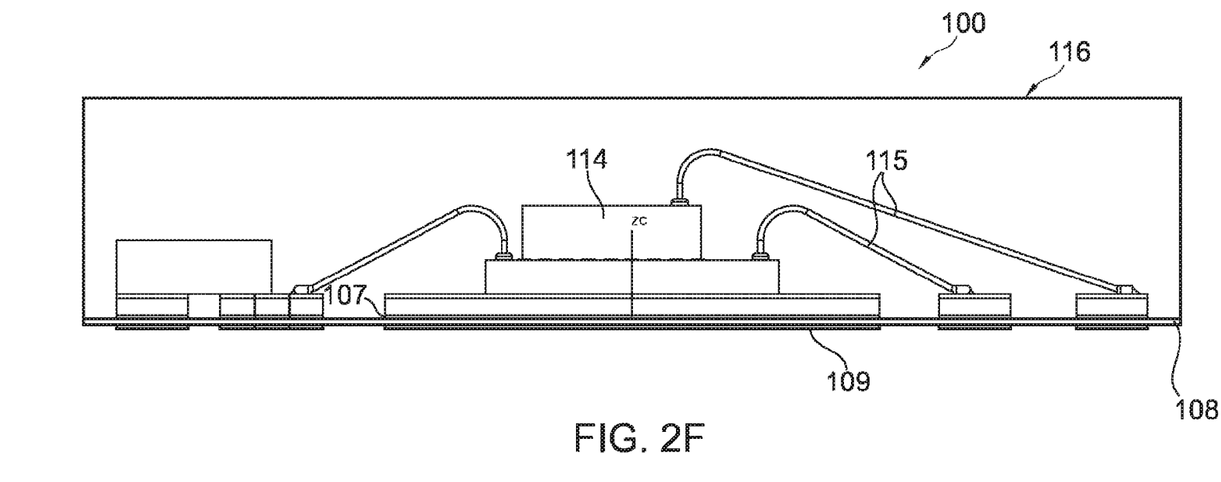

FIG. 2F shows a perspective view of the carrier 100 of FIG. 1F. In particular, the encapsulation 116 is applied to the carrier 100 which encapsulation encloses the upper part of the carrier 100, i.e. the contact pads 102, the intermediate pad 112, the semiconductor chip 114 and the bonding wires 115. However, FIG. 2F clearly shows that the encapsulation 116 does not enclose the first conductive layer 108 and the surface layer 109 which are arranged on the underside of the carrier 100.

Figure 2G:
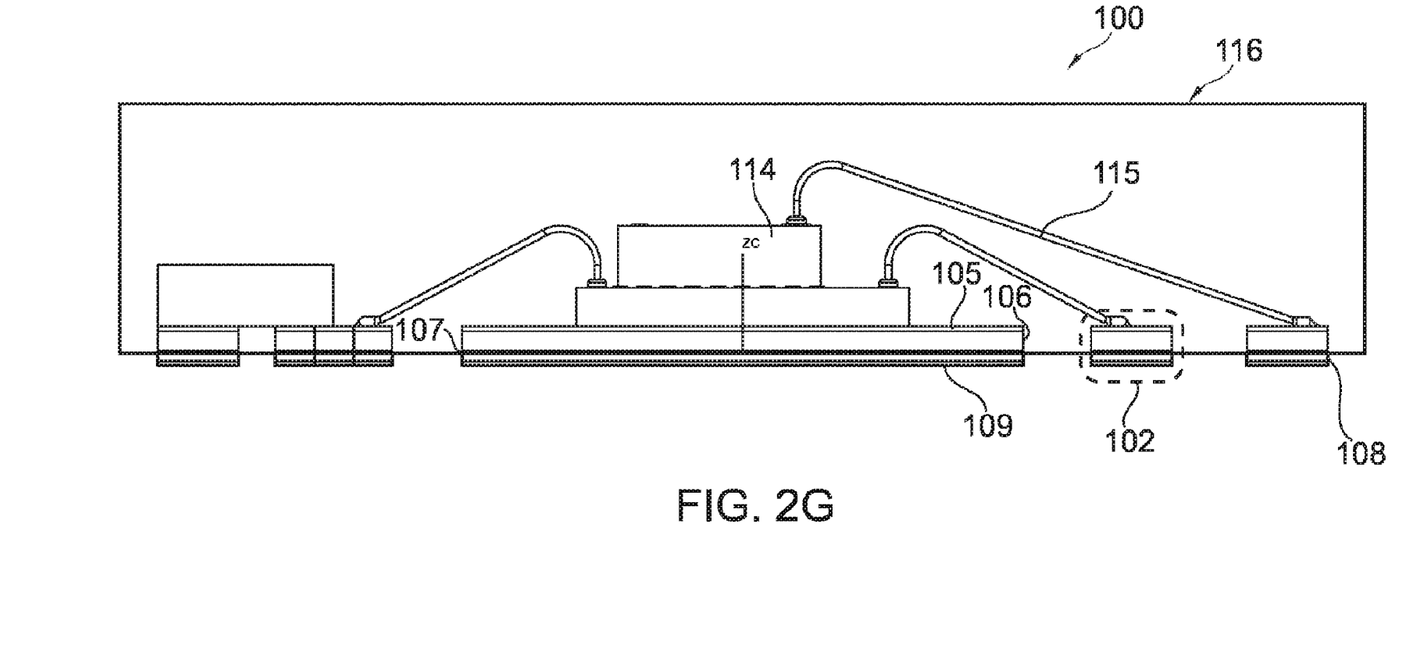

FIG. 2G shows a cross-sectional view of the carrier 100 of FIG. 1G. In particular, the underside of the carrier 100 is structured, i.e. more specific, the first conductive layer 108 and the buffer layer 107 are structured in order to provide terminals that may be used to contact the encapsulated semiconductor chip 114.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A carrier for bonding a semiconductor chip onto, the carrier comprising:
   a die pad; and
   a plurality of contact pads,
   wherein the die pad and each of the plurality of contact pads comprises an electrically conductive multilayer stack, wherein the electrically conductive multilayer stack comprises a surface layer, a barrier layer, and a first conductive layer;
   wherein the barrier layer comprises a material adapted to prevent diffusion of material of the surface layer into the first conductive layer;
   wherein both each of the plurality of contact pads and the die pad comprise an adhesion layer, a second conductive layer and a buffer layer;
   wherein at least two of the contact pads have an ultrafine pitch relative to each other.

2. The carrier according to claim 1,
   wherein the plurality of contact pads are arranged in at least two rings around the die pad.

3. The carrier according to claim 2,
   wherein at least some of the contact pads in a first ring of the at least two rings are located in a staggered position with respect to their neighbouring contact pads in a second ring of the at least two rings.

4. The carrier according to claim 1, wherein the barrier layer comprises palladium.

5. The carrier according to claim 1, wherein the thickness of the barrier layer is at least 0.1 micrometer.

6. The carrier according to claim 1,
   wherein the die pad comprises a main portion and an edge portion, wherein the main portion comprises a stack of the first conductive layer and the surface layer, while the edge portion comprises a second multilayer stack of an adhesion layer, a second conductive layer, a buffer layer, the first conductive layer and the surface layer.

7. The carrier according to claim 6,
   wherein the adhesion layer comprises a material which is specific for adhesion to copper and/or a material specific for adhesion to copper is applied onto the adhesion layer.

8. A semiconductor chip package, comprising:
   a carrier according to claim 1;
   a semiconductor chip; and
   an encapsulation,
   wherein the semiconductor chip has a first and an opposite, second side with a plurality of bond pads on the first side;
   wherein the semiconductor chip is attached with its second side to the die pad and wherein the at least one contact pad is electrically coupled to one of the plurality of bond pads of the semiconductor chip; and
   wherein the encapsulation encapsulates the semiconductor chip and mechanically anchors the die pad and the plurality of contact pads, while a surface of the contact pads is exposed from the encapsulation to constitute terminals.

9. The semiconductor chip package according to claim 8,
   wherein the die pad has a surface that is exposed from the encapsulation, which surface is divided into a plurality of islands.

10. The semiconductor chip package according to claim 8,
    wherein the multilayer stack of at least some of the plurality of contact pads comprise further:
    a buffer layer;
    a second conductive layer; and
    an adhesive layer.

11. The semiconductor chip package according to claim 10,
    wherein the at least some of the plurality of contact pads comprises a portion in the second conductive layer that laterally extends beyond the corresponding terminal.

12. A method of contacting a semiconductor chip to a carrier, the method comprising:
    providing a carrier comprising a die pad, a plurality of contact pads, wherein at least one of the contact pad and the die pad comprises:
    an electrically conductive multilayer stack of a surface layer, a barrier layer, and a first conductive layer, wherein the barrier layer is arranged between the first conductive layer and the surface layer, and both each of the plurality of contact pads and the die pad comprise an adhesion layer, a second conductive layer and a buffer layer;
    an ultrafine pitch relative to another one of the plurality of contact pads, and wherein the barrier layer comprises a material adapted to prevent diffusion of material of the surface layer into the first conductive layer;
   attaching a semiconductor chip onto the die pad, wherein the semiconductor chips comprises a plurality of bond pads; and
   contacting at least one bond pad with the at least one contact pad.
13. The method according to claim 12,
wherein the contacting is done by a soldering procedure.
14. The method according to claim 13,
wherein use is made of stencil soldering.
15. The method according to claim 13,
wherein a leadfree solder is used.
16. The method according to claim 15,
wherein the leadfree solder comprises tin, silver, copper and/or an alloy thereof.

* * * * *